United States Patent
Fox et al.

[11] 4,023,050
[45] May 10, 1977

[54] LOGIC LEVEL CONVERTER

[75] Inventors: Jeffrey R. Fox, Waltham; William D. Walsh, Franklin, both of Mass.

[73] Assignee: GTE Laboratories Incorporated, Waltham, Mass.

[22] Filed: May 10, 1976

[21] Appl. No.: 684,603

[52] U.S. Cl. .............................. 307/264; 307/208; 307/251; 307/279; 307/DIG. 1; 307/DIG. 4
[51] Int. Cl.[2] ................. H03K 17/60; H03K 17/04; H03K 3/286; H03K 3/353
[58] Field of Search .......... 307/205, 208, 214, 246, 307/251, 264, 279, DIG. 1, DIG. 3, DIG. 4; 58/23 A, 23 BA, 50 R

[56] References Cited
UNITED STATES PATENTS

| | | | |
|---|---|---|---|
| 3,612,908 | 10/1971 | Heimbigner | 307/251 X |
| 3,902,082 | 8/1975 | Proebsting et al. | 307/279 |
| 3,916,430 | 10/1975 | Heuner et al. | 307/DIG. 1 X |
| 3,942,043 | 3/1976 | Sirocka et al. | 307/DIG. 1 X |

Primary Examiner—John S. Heyman
Assistant Examiner—Larry N. Anagnos
Attorney, Agent, or Firm—Irving M. Kriegsman; Leslie J. Hart; Robert A. Seldon

[57] ABSTRACT

A logic level converter converts an input signal having first and second voltage levels to an output signal having first and third voltage levels in which the voltage excursion of the output signal is greater than that of the input signal. The converter comprises first and second cross-coupled inverters in which the second inverter provides the output signal and is biased with respect to the first and third voltage levels and in which the first inverter is biased with respect to the third voltage level and the digital input signal. A voltage divider is associated with the first inverter to insure sufficient voltage swing for proper switching of the inverters. The inverters have dissimilar gains to insure that when the inverters are biased at equal voltages, the inverters always assume a predetermined state. The converter is implemented with PMOS field effect transistors and includes capacitors for increasing switching speed.

13 Claims, 1 Drawing Figure

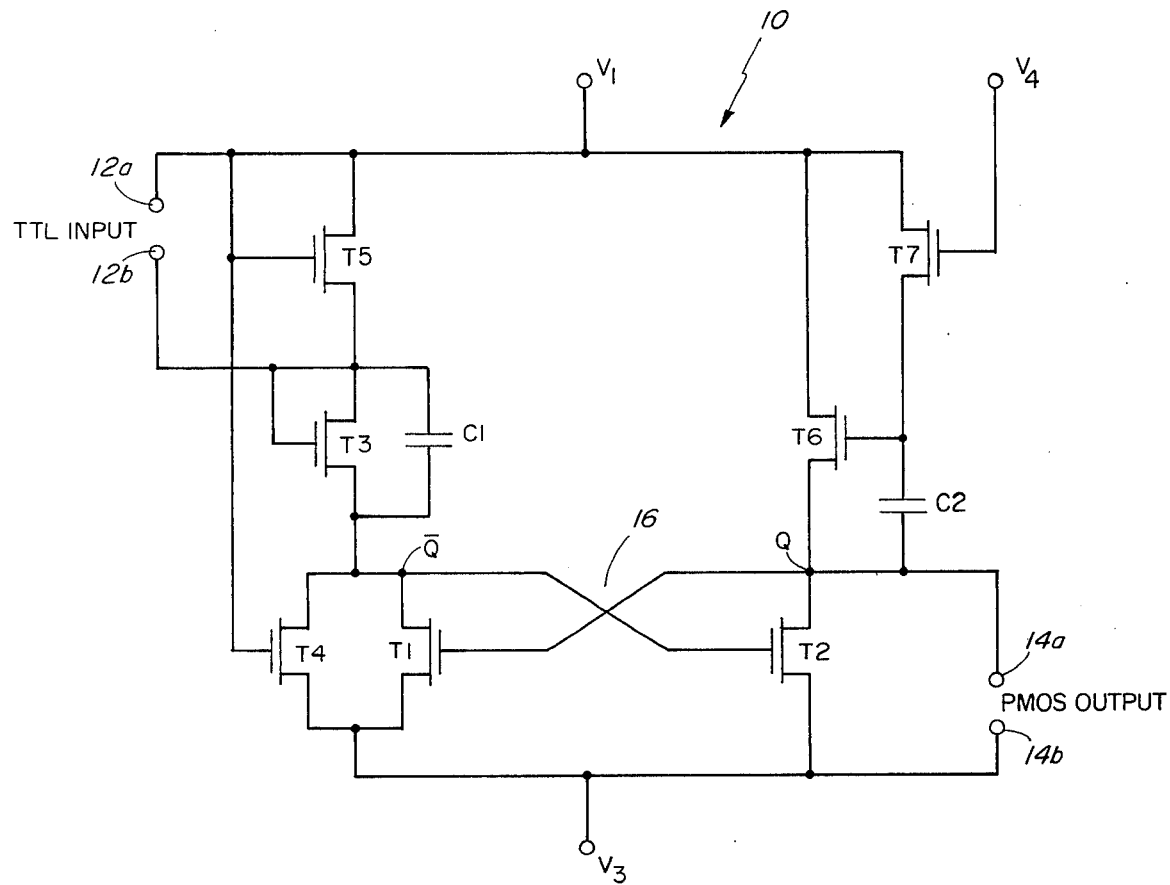

LOGIC LEVEL CONVERTER

FIELD OF THE INVENTION

The present invention relates to a circuit for converting the logic levels of a digital input signal from one type of logic circuit to logic levels which are compatible with another type of logic circuit, and more specifically, to a circuit for converting transistor-transistor logic (TTL) to metal-oxide-silicon (MOS) logic.

BACKGROUND OF THE INVENTION

The semiconductor integrated circuit technology is an example of where logic converters are utilized. The impact of semiconductor integrated circuit technology is being felt at all levels of our experience. This technology is being introduced in areas such as world-wide communications systems, sophisticated computers and personal objects like wristwatches, cameras and hand-held calculators. Integrated circuit technology is working along two main lines: one is based on the MOS field effect transistor (FET), and the other is based on the bipolar transistor approach. The primary advantage of the field effect transistor in large scale integrated circuitry resides in performance and relative ease of fabrication. The main performance advantage is low power. On the other hand, the main advantage in bipolar transistors for large scale integrated circuitry is device speed; typically, the bipolar transistor can operate ten times faster than a field effect transistor.

Frequently, in the development of large scale integrated circuitry to perform a certain function, MOS and TTL integrated circuit chips are inter-related. Accordingly, it is necessary to send digital signals which are generated in a TTL circuit to an MOS circuit, such as a $p$ channel MOS(PMOS) circuit. This usually requires some kind of conversion process since the logic levels are not directly compatible. Typically, TTL circuits utilize positive logic. On the other hand, PMOS circuits utilize negative logic in which the voltage excursion between levels is greater than that for the TTL logic circuits.

Circuits for converting from TTL to high threshold PMOS or low threshold PMOS are known. High threshold is intended to include FETs having threshold voltages ranging from about 2.5 to 3.5 volts while low threshold is intended to include FETs having threshold voltages ranging from about 0.8 to 1.5 volts. Presently known converters designed for operation with a high threshold PMOS process drain high quiescent current, are slow, and occupy a large amount of space. A typical converter includes a field effect transistor in which the TTL logic levels are applied to the gate, and the voltage at the source is derived from a resistive voltage divider network comprising diffusion resistors. Thus, the divider is always drawing current and its use of diffusion resistors requires a large space on the chip. Further, this converter was found to not operate at adequate speeds. On the other hand, converters designed for operation with a low threshold PMOS process may have undesirable noise immunity problems.

SUMMARY OF THE INVENTION

It is an object of the invention to provide an improved logic level converter of the type in which the voltage excursion of the input signal whose levels are to be converted are less than the voltage excursion of the output signal.

It is an additional object to provide an improved converter in which the input signal is of one type of logic and the output signal is of another type and in which one of the voltage levels for the digital input signal is approximately the same as one of the voltage levels of the digital output signal.

It is still an additional object to provide an improved high threshold PMOS circuit for converting TTL logic levels into high threshold PMOS logic levels which draws reduced quiescent current, occupies reduced space on the chip and operates at increased speeds.

According to the invention, there is provided a circuit for use in converting a digital input signal having a first logic type and having a voltage excursion equal to or less than the voltage excursion between first and second voltages to a related digital output signal having a second logic type and having a voltage excursion which is equal to or less than the excursion between the first voltage and the third voltage. Further, the voltage excursion of the output digital signal is greater than the voltage excursion of the input digital signal. The converter has first and second inverters, each of which has an inverter input and an inverter output which has an opposite logic level as the inverter input. The input of each inverter is coupled to the output of the opposite inverter so that the combination of inverters operates in a complementary manner. The second inverter is biased with respect to the first and third voltages and provides the digital output signal at its output. Accordingly, the first inverter is biased with respect to the third voltage and with respect to the digital input signal which is at either the first or the second voltage. The first inverter further has a voltage divider coupled thereto to produce at the output of the first inverter a voltage intermediate the first and third voltages and a voltage intermediate the second and third voltages. These intermediate voltages are effective to switch the output of the second inverter between the first and third voltages. Further, the first and second inverters have dissimilar gains to insure that the digital output signal is at a level corresponding to the third voltage when the digital input signal is at a level corresponding to the first voltage.

In a preferred embodiment of the invention, the converter is implemented with PMOS integrated circuitry and converts the standard logic levels of a TTL logic circuit to the logic levels of a high threshold PMOS circuit. Accordingly, the voltage divider and the inverters are implemented with field effect transistors. In another feature, a capacitor is utilized with both the first and second inverters for increasing the switching speed of the converter.

For a better understanding of the present invention, together with other and further objects, advantages and capabilities, reference is made to the following disclosure in conjunction with the accompanying drawing.

BRIEF DESCRIPTION OF THE DRAWING

In the drawing:
The sole FIGURE is a preferred embodiment of a converter according to the present invention.

DESCRIPTION OF THE PREFERRED EMBODIMENT

In an exemplary embodiment of the present invention, as shown in the sole FIGURE in the drawing, there is provided a circuit, represented generally by the reference numeral 10, for converting the logic levels of a digital input signal from a TTL circuit (not shown) but identified as "TTL INPUT" to form a digital output signal for a PMOS circuit (not shown) but identified as "PMOS OUTPUT". The TTL input signal typically is of the positive logic type in which a logic 0 is a first voltage of about 0 volts and a logic 1 is a second voltage of about +5 volts. Due to several factors known to those skilled in the art, these voltage levels may be only about +0.8 volts and +2.4 volts, respectively, thereby making the actual voltage excursion at most equal to and usually less than the voltage excursion between the first and second voltages. In the typical TTL circuit, the ground for the circuit is 0 volts and a terminal 12a is coupled to TTL circuit ground to define in the converter 10 a means providing the first voltage $V_1$. A terminal 12b receives the digital input signal from the TTL circuit, this signal varying between levels corresponding to the first and the second voltages. The converter 10 provides a digital output signal at a terminal 14a. This output signal is of the negative type of logic in which a logic 0 is of a third voltage of +12 volts and a logic 1 is of the first voltage of 0 volts. Thus, the voltage excursion (12 volts) between levels of the digital output signal is greater than the voltage excursion (5 volts) between the levels of the digital input signal. The third voltage $V_3$, which is provided from a suitable voltage source, is coupled to the substrate of the PMOS circuit forming the converter 10. This voltage is in turn coupled via a terminal 14b to the PMOS circuits receiving the digital output signal. Due to several factors known to those skilled in the art, the actual voltage levels at the output of the circuit 10 may be somewhat less than 0 and +12 volts, thereby making the actual voltage excursion of the digital output signal somewhat less than that between the first voltage $V_1$ and the third voltage $V_3$. In actual practice, this excursion is between about +1 volt and +10.5 volts.

The circuit 10 has a flip-flop, represented generally by the reference numeral 16, which includes first and second cross-coupled field effect transistors T1 and T2, respectively. The gate and drain of the first transistor T1 are coupled to the drain and gate, respectively, of the second transistor T2. Further, the source of the first and second transistors T1 and T2 is coupled to the third voltage $V_3$. Transistor T2 is biased with respect to the first voltage $V_1$ and the third voltage $V_3$. The transistor T1 is biased with respect to the third voltage $V_3$ and the voltage ($V_1$ or $V_2$) of the digital input signal. The second transistor T2 has a substantially higher gain than the gain of the first transistor T1 to insure that when equal voltages are applied to the flip-flop, which is when the digital input signal is at $V_1$, the second transistor is conductive and the first transistor is non-conductive.

A field effect transistor T3 has its gate and drain coupled to the terminal 12b and its source coupled to the drain of the transistor T1. A capacitor C1 is coupled across the drain and source of the transistor T3. This transistor forms a load device between the transistor T1 and the bias level at the input terminal 12b. A field effect transistor T4 has its source coupled to the third voltage $V_3$, its drain coupled to the drain of the transistor T1 and its gate coupled to $V_1$. A field effect transistor T5 has its gate and drain coupled to the first voltage $V_1$ and its source coupled to the input terminal 12b.

A field effect transistor T6 has its drain coupled to the first voltage $V_1$ and its source coupled to the drain of the transistor T2. Capacitor C2 is coupled across the gate and source of the transistor T6. A field effect transistor T7 has its source coupled to the gate of transistor T6, its drain coupled to the first voltage $V_1$ and its gate coupled to a fourth voltage $V_4$ which is −12 volts.

The following describes the values of the various components illustrated in the preferred embodiment.

| T1 | T4 | T7 |
|---|---|---|
| $\frac{W}{L} = \frac{1.0}{0.5}$ | $\frac{W}{L} = \frac{0.4}{1.0}$ | $\frac{W}{L} = \frac{0.4}{3.0}$ |
| T2 | T5 | C1 = 2.0 pf |
| $\frac{W}{L} = \frac{10.0}{0.5}$ | $\frac{W}{L} = \frac{0.5}{1.0}$ | C2 = 1.0 pf |
| | | $V_1$ = 0 volts |
| T3 | T6 | |
| $\frac{W}{L} = \frac{4.0}{0.5}$ | $\frac{W}{L} = \frac{1.0}{0.5}$ | $V_3$ = +12 volts |
| | | $V_4$ = −12 volts |

W is the channel width and L is the channel length in mils of the PMOS device. As is well-known, the gain of the field effect transistor is directly proportional to the width W and inversely proportional to the length L. Accordingly, the gain of the transistor T2 is substantially greater than the gain of the transistor T1; more specifically, T2 has a gain which is larger than the gain of T1 by a factor of about 10.

The flip-flop 16 consists of a first inverter comprising transistor T1 and a load device T3 and a second inverter comprising the transistor T2 and the load device T6. The second inverter is biased between the third voltage $V_3$ and the first voltage $V_1$ whereas the first inverter is biased between the third voltage $V_3$ and the digital input signal which may be either $V_1$ or $V_2$. When the digital input signal is at the first voltage $V_1$, there exists a situation wherein both inverters are biased with respect to the same voltage levels. Since transistor T2 is more conductive than transistor T1, the transistor T2 will become highly conductive and the transistor T1 becomes substantially non-conductive due to regenerative action. Accordingly, the voltage at the terminal 14a will be close to the voltage $V_3$. Transistor T1 is substantially non-conductive because its gate voltage is close to $V_3$ thereby providing a gate to source voltage for T1 which is less than the threshold voltage of the transistor T1. The transistors T3 and T4 form a voltage divider network for establishing an intermediate voltage at the output designated $\overline{Q}$ of the first inverter which is the drain of the transistor T1. Transistors T3 and T4 are conductive regardless of the state of the digital input signal since, regardless of the state, their gate to source voltages are greater than their threshold voltages. Accordingly, transistor T4 provides a conductive path from the input terminal 12b to the third voltage $V_3$, regardless of the conductive state of the transistor T1. When the digital input signal is at the first voltage or 0 volts, the intermediate voltage at $\overline{Q}$, the output of the first inverter, is approximately +5.5 volts. The particular voltage is related to the ratio of the drain to source impedance of T3 and T4. When the digital input signal goes to the second voltage $V_2$ which is +5 volts, the intermediate voltage at $\overline{Q}$, the output of the first inverter, eventually is between +12 volts and +5 volts and in the embodiment is approximately +10.5 volts. This voltage which is applied to the gate of the transistor T2 causes the gate to source voltage at T2 to become less than the threshold voltage, thereby making the transistor T2 non-conductive. As transistor T2 decreases conduction, the inverter output at the drain of the transistor T2 becomes closer to the first voltage $V_1$ which then causes the transistor T1 to become more conductive. Also, when the digital input signal goes to the level corresponding to the second voltage $V_2$, the transistor T5 becomes conductive since its gate to source voltage is now greater than its threshold voltage. When T5 conducts, a shunt path is provided between the terminals 12a and 12b so that the converter 10 does not tend to deliver an excessive amount of current into the TTL circuit. The transistor T5 is non-conductive when the digital input signal is at the first voltage since at that time the gate to source voltage is less than the threshold and the drain to source voltage is essentially zero volts.

The ratio of the gains of the transistors T2 and T6 establishes how close the digital output signal becomes with respect to the third voltage level $V_3$. In the embodiment, the voltage drop across the transistor T2 when it is conducting is in the order of about 1.5 volts thereby making the output voltage approximately +10.5 volts. Without the presence of the transistor T7, the output voltage at terminal 14a when the transistor T2 is non-conductive is established by the threshold voltage of the transistor T6. As is known in the art by applying a voltage to the gate of the transistor T7 which is more negative than the first voltage $V_1$ by more than the threshold voltage, it is possible to make the source voltage at T6 more closely approach the first voltage $V_1$. In this embodiment, the source voltage is approximately +1 volt, instead of about +3 volts as would exist if T7 were not used.

The purpose of the capacitor C1 is to increase the switching speed of the intermediate voltage levels at $\overline{Q}$, the output of the first inverter, in response to the variation in the voltage levels of the digital input signal. When the digital input signal is at the first voltage $V_1$, the voltage across the capacitor C1 is approximately 5.5 volts since that is the voltage drop across the transistor T3. As stated previously, this voltage of +5.5 volts is sufficient to cause the transistor T2 to be conductive and the transistor T1 to be non-conductive. As the digital input signal switches to the second voltage $V_2$ thereby putting about +5 volts on the upper terminal of C1, the opposite terminal of the capacitor C1 becomes about +10.5 volts for an instant since the voltage across a capacitor cannot change instantaneously. Without the capacitor C1, the voltage at the drain of the transistor T1 would not become +10.5 volts until the regenerative action of T2's decreasing conduction and T1's increasing conduction has been completed. However, because of capacitor C1 the transistor T2 becomes non-conductive and the transistor T1 becomes conductive in a much shorter time interval. The capacitor C1 is now charged to approximately 6 volts. When the digital input signal switches to the first voltage $V_1$, the voltage at the opposite terminal of the capacitor C1 becomes about +6.0 volts for an instant since the voltage across a capacitor cannot change instantaneously.

The purpose of the capacitor C2 is to increase the switching speed of the output signal when the output goes from the third to the first voltage levels. When the output signal is at +10.5 volts, C2 is charged to about 10.5 volts. As the output signal starts to go towards 0 volts, capacitor C2 instantaneously causes the gate of T6 to go to a negative voltage level.

The embodiment of the present invention is intended to be merely exemplary and those skilled in the art shall be able to make numerous variations and modifications of it without departing from the spirit and scope of the present invention. All such variations and modifications are intended to be within the scope of the present invention as defined by the appended claims.

We claim:

1. A circuit for use in converting a digital input signal having a first logic type and a voltage excursion which is equal to or less than the voltage excursion between first and second voltages to a related digital output signal having a second logic type and a voltage excursion which is equal to or less than the voltage excursion between the first voltage and a third voltage and which is greater than the voltage excursion of the input digital signal, including:

a. means for providing the first and the third voltages;
   b. first and second inverters, each of which has an input and an output which is the opposite logic level as the input, the input of each inverter being coupled to the output of the opposite inverter,
   c. the second inverter being biased with respect to the first and third voltages and providing the digital output signal at the output thereof,
   d. the first inverter being biased with respect to the third voltage and the digital input signal voltage, the first inverter further having voltage divider means coupled thereto to produce at the output of the first inverter a voltage intermediate the first and third voltages and a voltage intermediate the second and third voltages, the intermediate voltages being effective to switch the output of the second inverter between the first and third voltages, and
   e. the first and second inverters having dissimilar gains for insuring that the digital output signal is at a level corresponding to the third voltage when the digital signal is at a level corresponding to the first voltage.

2. The circuit according to claim 1 wherein the first and second inverters include first and second cross-coupled field effect transistors, respectively, and wherein the second transistor has a substantially higher gain than the first transistor so that when the inverters are both biased with respect to the first and third voltages, the second transistor conducts and the first transistor is substantially non-conductive.

3. The circuit according to claim 2 wherein the second inverter includes a third field effect transistor having its source and drain respectively coupled to the second transistor and the first voltage and further including a capacitor coupled to the gate of the third transistor for increasing the speed of switching the digital output signal between levels.

4. The circuit according to claim 3 wherein the second transistor has a source coupled to the third voltage, a drain defining the output of the second inverter and a gate defining the input of the second inverter and wherein the third field effect transistor has its source coupled to the drain of the second transistor and its drain coupled to the first voltage, and a fourth field effect transistor having its source coupled to the gate of the third transistor, its drain coupled to the first voltage and its gate coupled to a source of a fourth voltage which is greater than the first voltage by an amount at least equal to the threshold voltage of the third transistor so that the output voltage of the second inverter is substantially equal to the first voltage when the second transistor is substantially non-conductive, the capacitor being coupled between the gate and source of the third transistor.

5. The circuit according to claim 4 wherein the gain of the second transistor is substantially greater than the gain of the third transistor so that the output of the second inverter is substantially equal to the third voltage when the third and the second transistors are conducting.

6. The circuit according to claim 22 wherein the first inverter includes load means receiving the digital input signal at one side thereof and being coupled at another side to the first field effect transistor and further including a capacitor coupled across the load means for increasing the speed of switching the intermediate voltages in response to the digital input signal.

7. The circuit according to claim 6 wherein the first and second transistors have their source electrodes coupled to the third voltage, their drain electrodes defining the inverter output and their gate electrodes defining the inverter input and wherein the load means includes a third field effect transistor whose gate and drain electrodes receive the digital input signal and whose source is coupled to the drain of the first transistor.

8. The circuit according to claim 7 wherein the divider means includes a fourth field effect transistor whose source and drain are coupled across the source and drain of the first transistor, respectively, and whose gate is coupled to the first voltage, the fourth transistor providing a conductive path between the third voltage and the digital input signal to establish the intermediate voltages irrespective of the state of conduction of the first transistor.

9. The circuit according to claim 2 wherein the source of the digital input signal is a transistor-transistor logic circuit and wherein the converter is a p channel metal-oxide-silicon integrated circuit.

10. The circuit according to claim 9 wherein the means providing the first voltage comprises a connection to the ground terminal of the transistor-transistor logic circuit, the ground terminal being at zero volts and wherein the second voltage is about plus five volts.

11. The circuit according to claim 10 wherein the means providing the third voltage comprises a source of plus twelve volts coupled to the substrate of the p channel metal-oxide-silicon integrated circuit.

12. A circuit for use in converting a digital input signal having a first logic type and a voltage excursion which is equal to or less than the voltage excursion between first and second voltages to a related digital output signal having a second logic type and a voltage excursion which is equal to or less than the voltage excursion between the first voltage and a third voltage and which is greater than the voltage excursion of the input digital signal, including:
 a. means for providing the first and the third voltages;
 b. first and second inverters, each of which has an input and an output which is in the opposite logic level as the input, the input of each inverter being coupled to the output of the opposite inverter,
 c. the second inverter being biased with respect to the first and third voltages and providing the digital output signal at the output thereof,
 d. the first inverter being biased with respect to the third voltage and with respect to the digital input signal, the first inverter further having voltage divider means coupled thereto to produce at the output of the first inverter a voltage intermediate the first and third voltages and a voltage intermediate the second and third voltages, the intermediate voltages being effective to switch the output of the second inverter between the first and third voltages,
 e. the first and second inverters having dissimilar gains for insuring that the digital output signal is at a level corresponding to the third voltage when the digital input signal is at a level corresponding to the first voltage;
 f. the first and second inverters respectively including first and second cross-coupled field effect transistors the second transistor has a substantially higher gain than the first transistor so that when the inverters are both biased with respect to the first and third voltages, the second transistor conducts and the first transistor is substantially non-conductive.
 g. the first inverter including load means receiving the digital input signal at one side thereof and coupled at another side to the first field effect transistor, and further including a capacitor coupled across the load means for increasing the speed of switching the intermediate voltages in response to the digital input signal,
 h. the first and second transistors having their source electrodes coupled to the third voltage, their drain electrodes defining the inverter output and their gate electrodes defining the inverter input, the load means including a third field effect transistor whose gate and drain electrodes receive the digital input signal and whose source is coupled to the drain of the first transistor,
 i. the divider means including a fourth field effect transistor whose source and drain are respectively coupled across the source and drain of the first transistor and whose gate is coupled to the first voltage, the fourth transistor providing a conductive path between the third voltage and the digital input signal to establish the intermediate voltages irrespective of the state of conduction of the first transistor,
 j. the divider means further including means providing a conductive path from the side of the load means receiving the digital input signal to the first voltage when the digital input signal is at a level corresponding to the second voltage to limit current flow into a source of the digital input signal.

13. The circuit according to claim 12 wherein the means for providing the conductive path includes a fifth field effect transistor whose drain and gate are coupled to the first voltage and whose source is coupled to the drain of the third transistor so that the fifth transistor conducts when the digital input signal is at a level corresponding to the second voltage and is non-conductive when the digital input signal is at a level corresponding to the first voltage.

* * * * *